United States Patent [19]

Mills et al.

[11] 4,155,784
[45] May 22, 1979

[54] PROCESS FOR EPITAXIALLY GROWING A GALLIUM ARSENIDE LAYER HAVING REDUCED SILICON CONTAMINANTS ON A GALLIUM ARSENIDE SUBSTRATE

[75] Inventors: Thomas G. Mills, Carson; Wallace T. Anderson, Jr., Huntington Beach; Arthur D. Herbig, San Jose, all of Calif.

[73] Assignee: TRW Inc., Redondo Beach, Calif.

[21] Appl. No.: 785,881

[22] Filed: Apr. 8, 1977

[51] Int. Cl.$^2$ .................. H01L 21/205; H01L 21/465; H01L 29/20
[52] U.S. Cl. ...................................... 148/175; 29/571; 156/610; 156/612; 156/613; 357/15; 357/23; 357/61; 427/84
[58] Field of Search ................ 148/174, 175; 156/610, 156/612, 613; 427/84; 29/571, 578; 357/15, 23, 61

[56] References Cited

U.S. PATENT DOCUMENTS

| | | |
|---|---|---|
| 3,310,425 | 3/1967 | Goldsmith ........................ 148/175 X |
| 3,394,390 | 7/1968 | Cheney ............................. 148/175 X |
| 3,441,000 | 4/1969 | Burd et al. ........................ 148/175 X |
| 3,471,324 | 10/1969 | Wilson et al. ..................... 148/175 X |
| 3,511,723 | 5/1970 | Burd ................................. 148/175 |
| 3,609,477 | 9/1971 | Drangeid et al. ................. 357/23 X |
| 3,767,984 | 10/1973 | Shinoda et al. ................... 357/23 X |
| 3,904,449 | 9/1975 | DiLorenzo et al. ................ 148/175 |
| 3,930,908 | 1/1976 | Jolly ................................. 148/175 |

OTHER PUBLICATIONS

DiLorenzo, J. V., "Vapor Growth of Epitaxial GaAs ---.", J. of Crystal Growth, vol. 17 (1972), pp. 189-206.
Shaw, D. W., "Epitaxial GaAs Kinetic Studies: (001) Orientation", J. Electrochem. Soc., vol. 117, No. 5, May 1970, pp. 683-687.
Weiner, M. E., "Li Contamination - - - GaAs and GaP", J. Electrochem. Soc., vol. 119, No. 4, Apr. 1972, pp. 496-504.
Pruniaux et al., "Semi-Insulated Gate Gallium Arsenide FET", IEEE Trans. on Electron Dev., vol. Ed.-19, No. 5, May 1972, pp. 672-674.
Becke et al., "Gallium Arsenide FET's - - -", Electronics, Jun. 12, 1967, pp. 82-90.
Shaw et al., "Gallium Arsenide Epitaxial Technology", 1966 Symposium on GaAs, Paper No. 2, pp. 10-15.
Enstrom et al., "Influence of Gas-Phase Stoichiometry - - -", J. Electrochem. Soc., vol. 121, No. 11, Nov. 1974, pp. 1516-1523.
Ing et al., "Open Tube Epitaxial - - - GaAs and GaP", J. Electrochem. Soc., vol. 109, No. 10, Oct. 1962, pp. 995-997.

Primary Examiner—L. Dewayne Rutledge
Assistant Examiner—W. G. Saba
Attorney, Agent, or Firm—Robert W. Keller; Edwin A. Oser; John J. Connors

[57] ABSTRACT

A process for epitaxially forming a layer of gallium arsenide having a first conductivity on a substrate of gallium arsenide having a second conductivity in an enclosure having an inner liner comprised of a silicon compound, comprising decomposing arsine to form arsenic; chemically reacting a first quantity of hydrogen chloride and gallium to form gallium chloride, the gallium chloride reacting with the arsenic to form gallium arsenide on the substrate, a portion of the first quantity of hydrogen chloride remaining unreacted and tending to cause silicon contaminants from the liner to be deposited on the substrate; and providing a second quantity of hydrogen chloride into the enclosure which serves to initially etch, and hence clean, the outer surface of the substrate prior to the formation of gallium arsenide thereon, and simultaneously tends to inhibit the formation of silicon contaminants on the substrate, the second quantity and the first quantity having a preselected ratio such that the growth rate of the gallium arsenide layer on the substrate is greater than the etching rate of gallium arsenide due to the second quantity of hydrogen.

13 Claims, 2 Drawing Figures

PROCESS FOR EPITAXIALLY GROWING A GALLIUM ARSENIDE LAYER HAVING REDUCED SILICON CONTAMINANTS ON A GALLIUM ARSENIDE SUBSTRATE

BACKGROUND OF THE INVENTION

This invention relates generally to doped gallium arsenide semiconductor devices and particularly relates to such a device having epitaxially grown buffer and active layers with very low background doping.

It has previously been suggested to grow an eptiaxial gallium arsenide layer on a gallium arsenide substrate having relatively low background doping. In this process it was necessary to utilize arsenic trichloride ($AsCl_3$). The lowest doping obtainable with a quartz tube using arsine ($AsH_3$) and (HCl) hydrogen chloride was $4 \times 10^{14}$ doping of active carrier atoms per cubic centimeter. If a quartz tube is utilized incorporating a boron nitride liner, the background doping level can be reduced to $1.9 \times 10^{14}$ atoms per cubic centimeter.

There are several disadvantages to the known process. In the first place boron nitride liners are very expensive and may in turn cause additional problems. Furthermore a doping level of $1.9 \times 10^{14}$ atoms/cm$^3$ is not useful for FET's. Additionally, arsenic trichloride cannot be adapted to large scale production. The reason is that in the formation of $GaCl_3$, GaAs formed over the Ga melt limits the amount of $GaCl_3$ formed. The reaction somewhat simplified is as follows:

$$3H_2 + 2 Ga + 2 AsCl_3 \rightarrow 2 GaAs + 6 HCl \quad (1)$$

One problem with this reaction is that a skin of gallium arsenide forms on the gallium in the reservoir of the furnace. This skin slows down the reaction rate and hence limits the production available with this system.

The prior art is exemplified by a paper by John W. Burd which appears in Transactions of the Metallurgical Society of AIME, Vol. 245, March 1968, pages 571 – 576. Among other things this paper discloses a furnace suitable for the type of reaction to which the present invention relates.

It is accordingly an object of the present invention to provide an improved process for growing epitaxially gallium arsenide on a doped gallium arsenid substrate in such a manner that the epitaxial layer has very low background doping.

Another object of the present invention is to carry out the process in a furnace having a quartz liner which tends to provide silicon doping while maintaining the dopant at low levels.

A further object of the present invention is to provide a reaction of the type disclosed wherein hydrogen chloride is supplied at a level sufficiently low to substantially prevent etching of the epitaxial layer but sufficiently high to substantially inhibit doping of the epitaxial layer with silicon.

Still another object of the present invention is to provide a process for epitaxially forming a layer of gallium arsenide having a first conductivity on a substrate of gallium arsenide having a second conductivity in an enclosure having an inner liner comprised of a silicon compound, comprising decomposing arsine to form arsenic; chemically reacting a first quantity of hydrogen chloride and gallium to form gallium chloride, the gallium chloride reacting with the arsenic to form gallium arsenide on the substrate, a portion of the first quantity of hydrogen chloride remaining unreacted and tending to cause silicon contaminants from the liner to be deposited on the substrate; and providing a second quantity of hydrogen chloride into the enclosure which serves to initially etch, and hence clean, the outer surface of the substrate prior to the formation of gallium arsenide thereon, and simultaneously tends to inhibit the formation of silicon contaminants on the substrate, the second quantity and the first quantity having a preselected ratio such that the growth rate of the gallium arsenide layer on the substrate is greater than the etching rate of gallium arsenide due to the second quantity of hydrogen.

SUMMARY OF THE INVENTION

In accordance with the present invention the process is carried out in a furnace which is quartz lined. The substrate consists of single crystal, gallium arsenide doped with chromium. In order to prevent the chromium from the substrate to migrate into the active layer, a buffer layer is first grown. The buffer layer has very low background doping, that is less than $10^{13}$ donor impurities or active carriers per cm$^3$.

The furnace conventionally contains a gallium reservoir and a wafer holder which may be made to rotate. The furnace is first purged or flashed out with molecular hydrogen. Then arsine ($AsH_3$) and hydrgen is introduced for say one minute. For a period of half a minute a high flow of hydrogen chloride is added. This is then continued to obtain a growth rate of the epitaxial layer of between 0.1 and about $0.3 \times 10^{-4}$ cm per minute.

The reaction is carried out at a controlled rate of mole fractions of the molecular hydrogen, and the hydrogen chloride compared to the gallium.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

DESCRIPTION OF THE PREFERRED EMBODIMENT

Figure 1:
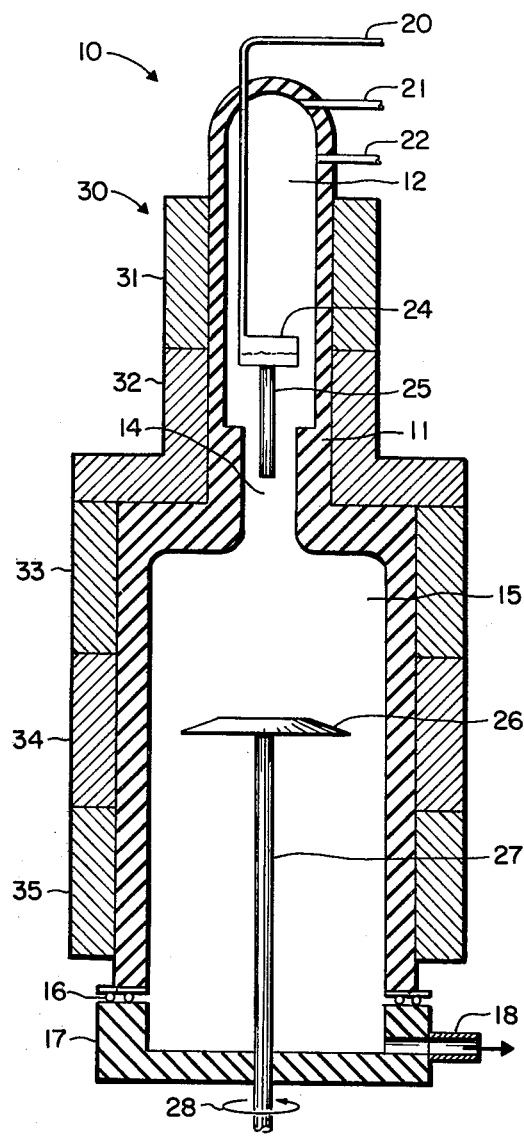
FIG. 1 is a cross-section partly in elevation of a furnace suitable for carrying out the process of the present invention.

Referring now to the drawing and particularly to FIG. 1, there is illustrated a furnace or reactor tube 10 suitable for carrying out the process of the present invention. The upright furnace 10 consists of an inner liner 11 which preferably consists of quartz ($SiO_2$). The liner 11 has an upper portion 12 forming a generally cylindrical upper chamber, a reduced portion 14 and an enlarged cylindrical lower portion 15.

For purposes of exhausting and cleaning the furnace tube 10 there may be provided a vacuum seal 16 for sealing the liner 11 against a closure portion or cap 17 having an exhaust port 18. The vacuum seal 16 may, for example, consist of suitable O-rings capable of withstanding the high temperatures provided in the furnace.

The furnace tube is further provided with three separate inlet ports 20, 21 and 22 extending through the liner 11. A container or reservoir 24 is suitably supported in the furnace 10 as indicated by the support 25. The reservoir 24 is adapted to contain a quantity of gallium. The inlet port 20 extends into the reservoir 24 as shown. Finally the furnace is provided with a rotating wafer holder 26 on which the gallium arsenide is epitaxially grown. The wafer holder 26 preferably also consists of quartz and is capable of holding several semiconductor devices. The wafer holder 26 is supported by a stem 27 which may be rotated as indicated by the arrow 28.

Finally the liner 11 is surrounded by one or more heater elements 30. Preferably they are arranged in sections to provide separate heat control. Thus the heater section 31 may surround the upper chamber 12. The heater section 32 follows in a downward direction and is adapted to heat a portion of the reduced intermediate chamber 14. This is followed by three more heater sections 33, 34 and 35 arranged in sequence and providing separate heating control for the lower large chamber 15. The heater sections may each consist of heater coils or windings surrounded by a refractory or heat resistant material such as asbestos. Preferably the heater sections 31 - 35 are made in the form of a clam shell so that they can be readily opened or closed about the furnace liner.

By virtue of the fact that there are five heater sections it is possible to heat five zones in the furnace 10 to different temperatures. Thus the heater section 31 serves the purpose to preheat the gases entering through the inlet ports 20 - 22. The next heater section 32 maintains the gallium reservoir 24 at the desired temperature. The heater section 34 maintains the wafer holder 26 where the epitaxial reaction takes place at its proper temperature. The heater section 33 above the wafer holder 26 serves as a buffer zone to stabilize the temperature above the wafer holder 26. The zone created by heater section 35 serves a similar purpose and operates as a buffer zone for the wafer holder 26.

Figure 2:
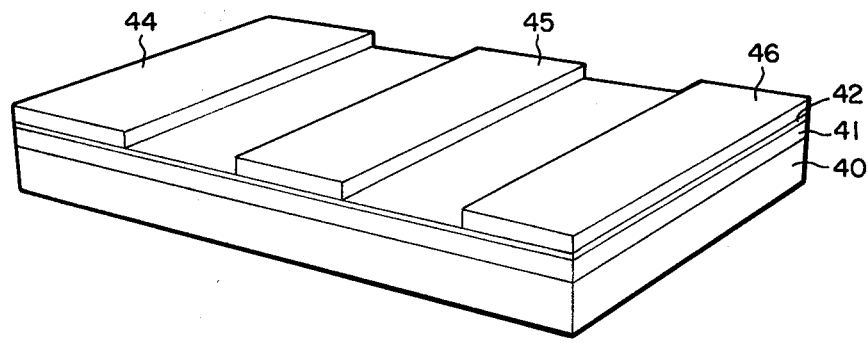
FIG. 2 is a view in perspective of a field effect transistor (FET) provided with epitaxially grown buffer and active layers in accordance with the present invention.

One or more suitable substrates such as the substrate 40 of FIG. 2 may now be loaded on the wafer holder 26. The substrate consists of an N-type single crystal of gallium arsenide (GaAs). In order to increase the resistivity of the substrate it is doped with a P-type dopant such as chromium so that the resistivity of the substrate is on the order of $10^6$ ohm-cm. The substrate has a mobility of between about 1100 to about 2000 $cm^2$/volt/sec. Preferably the wafers are sliced 3° to 5° off the (100) crystalline plane in the direction of the (110) plane. This misorientation of the wafer serves the purpose of minimizing lattice defects during the epitaxial growth. When desired it also facilitates ion implantation.

Now the cylindrical chamber 15 or wafer holder 26 is rapidly brought to the desired deposition temperature.

Now molecular hydrogen, as well as HCl are introduced through input port 20. The mole fraction of the $H_2$ with respect to the gallium source is between approximately $3.08 \times 10^{-2}$ and $3.57 \times 10^{-2}$. Similarly the HCl mole fraction with respect to the gallium source is between $2.67 \times 10^{-2}$ to $2.96 \times 10^{-2}$.

Molecular hydrogen and arsine ($AsH_3$) are introduced into input port 21. In this case the mole fraction of the $H_2$ is between $5.76 \times 10^{-1}$ to $6.67 \times 10^{-1}$. The mole fraction of the arsine is between $1.13 \times 10^{-2}$ and $1.31 \times 10^{-2}$.

Finally a secondary flow of molecular hydrogen and HCl is introduced into input port 22. The hydrogen mole fraction is between $1.80 \times 10^{-1}$ and $2.08 \times 10^{-1}$ while that of the HCl is between $4.52 \times 10^{-2}$ and $1.75 \times 10^{-1}$.

During the growing process the temperature of the upper zone provided by the heater section 31 is between 500° C. (centigrade) and 845° C. The temperature of the gallium source 24 is between 750° C. and 776° C. The temperature of the reaction zone, that is the zone provided by the heater section 32, is between 700° C. and 774° C. The buffer zone above the substrate provided by the heater section 33 is between 650° C. and 750° C. Finally the temperature at which the substrate is maintained, that is the temperature near the wafer holder 26 is between 600° C. and 750° C.

The reaction is now maintained to grow epitaxially a buffer layer shown at 41 in FIG. 2. The buffer layer should have a thickness between about 2 and about 15 microns or between 2 and $15 \times 10^{-4}$ cm. The buffer zone or layer should have a number of dopant atoms or active carriers of about $10^{12}/cm^3$. It should have a mobility of more than 6,000 $cm^2$/volt/sec.

Subsequently the active layer 42 is grown in a similar manner. It should have a thickness between $0.2 \times 10$hu −4 and $5 \times 0 \ 10^{-4}$ cm. The concentration of the dopant atoms or active carriers is between $10^{15}$ and $2 \times 0 \ 10^{17}/cm^3$. The mobility is between 4,500 and 7,000 $cm^2$/volt/sec. It should be noted that the lower mobility and the lower thickness should correspond to the higher concentration of active carriers. The active layer may be doped with sulphur in the form of $H_2S$.

It should be noted that the epitaxial growth takes place from the vapor phase at about atmospheric pressure. During the reaction the furnace may be sealed off, that is the output port 18 may be closed. The purpose of the buffer layer is to prevent the migration of the chromium atoms which are used as a P-type dopant from the substrate 40 into the active layer 42 and to minimize interfacial traps. On the other hand, the buffer layer has a very low doping concentration, say less than $10^{13}/cm^3$ dopant impurities. On the other hand, the active layer has a much higher concentration of doping atoms. Furthermore, the deposition of silicon on the buffer layer is substantially prevented by the high mole fraction of HCl which is used. In general the concentration of HCl is such that it substantially inhibits doping of the epitaxial layer by silicon while it is substantially insufficient to cause etching.

The following chemical reactions are believed to take place. Thus the formation of the GaCl at the gallium reservoir 24 takes place by the following reaction.

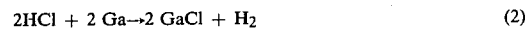
$$2HCl + 2 Ga \rightarrow 2 GaCl + H_2 \tag{2}$$

The arsine gas decomposes at the high temperature to arsenic vapor in accordance with the following equation.

$$2AsH_3 \rightarrow \tfrac{1}{2} As_4 + 3 H_2 \tag{3}$$

The epitaxial growth on the gallium arsenide of the substrate takes place as follows:

$$\tfrac{1}{2} As_4 + 3GaCl \ 2 \ GaAs + GaCl_3 \tag{4}$$

The silicon which evaporates from the quartz liner may form chlorosilanes at high temperature by reaction with molecular hydrogen and HCl. This may in turn decompose again into silicon. However this process is minimized by increasing the mole fraction of HCl during the reaction.

FIG. 2 illustrates by way of example an FET. Such a device has a source 44, a gate 45 and a drain 46. The gate is a Schottky barrier electrode which may consist, for example, of a layer of aluminum suitably deposited. The source and drain are ohmic electrodes. They may, for example, each be represented by a layer of gold and germanium which will provide such an ohmic electrode.

It should be noted that the device of the invention consisting of a substrate 40, a buffer layer 41 and an active layer 42 may be used for other devices besides FET's operating in the depletion mode. They may also be used for TED's (transfer electron devices) or combinations of FET's and TED's in integrated circuits. Additionally they are useful as a laser material, for example for optical lasers and for SAW (surface acoustic wave) devices. Such devices are generally useful in the range between 1 and 16 gigahertz. It will, of course, be understood that the electrodes used for such devices are entirely conventional.

There has thus been disclosed a process for epitaxially growing gallium arsenide layers on a gallium arsenide substrate. The process is characterized in that it can be carried out in a quartz lined furnace while minimizing the undesirable deposition of silicon impurities. A buffer layer is provided which substantially inhibits the migration of P-type chromium impurities from the substrate into the active layer. Yet the buffer layer has a low impurity concentration while the active layer has a higher active carrier concentration. Resulting devices are useful as FET's or TED's or laser material and the like.

What is claimed is:

1. A process for epitaxially depositing a gallium arsenide layer on a gallium arsenide substrate in a quartz furnace comprising the steps of:
   a. providing a gallium arsenide substrate in a quartz furnace;
   b. providing a gallium reservoir in the furnace;
   c. purging the furnace with a flow of molecular hydrogen;
   d. introducing hydrogen chloride having a mole fraction between approximately $2.67 \times 10^{-2}$ to approximately $1.75 \times 10^{-1}$;
   e. simultaneously introducing molecular hydrogen at a mole fraction of approximately $1.80 \times 10^{-1}$ and approximately $2.08 \times 10^{-1}$;
   f. simultaneously introducing arsine at a mole fraction between approximately $1.13 \times 10^{-2}$ and approximately $1.31 \times 10^{-2}$;
   g. maintaining a reaction zone proximate the gallium reservoir at a temperature that is greater than that proximate a buffer zone above the substrate introducing a quantity of hydrogen chloride into the gallium reservoir to form gallium chloride said gallium chloride reacting with said arsine, thereby epitaxially growing a gallium arsenide layer on the substrate; and
   h. continuing the epitaxial growth until a buffer layer is formed on the substrate and until an active layer is formed on the buffer layer.

2. A process as recited in claim 1 wherein said buffer layer is grown for a period of between about 10 and about 15 minutes.

3. A process as recited in claim 1 wherein the active layer is grown at a growth rate of between approximately 0.1 and approximately $0.3 \times 10^{-4}$ centimeter per minute.

4. A process for epitaxially forming a layer of gallium arsenide having a first conductivity on a substrate of gallium arsenide having a second conductivity in an enclosure having an inner liner comprised of a silicon compound, comprising:
   reacting hydrogen chloride with gallium to form gallium chloride;
   decomposing arsine to form arsenic, said gallium chloride reacting with said arsenic to form gallium arsenide on the substrate and said hydrogen chloride tending to cause silicon contaminants from the liner to be deposited on the substrate; and
   providing additional hydrogen chloride to the substrate to shift the equilibrium of said reaction to inhibit the formation of silicon on the substrate, thereby enabling the formation of a relatively pure layer of gallium arsenide on the substrate.

5. A process as recited in claim 4 wherein the temperature of said gallium chloride is greater than that of the substrate.

6. A process as recited in claim 5 wherein the temperature of said gallium chloride is in the range between 750 and 776° C. and the temperature of the substrate is in the range between 600 and 750° C.

7. A process as recited in claim 4 wherein the layer serves as a buffer layer and further comprising the additional steps recited in claim 4 to form a second layer overlaying said buffer layer, said second layer being doped with sulfur so as to have a greater concentration of dopant atoms than said buffer layer.

8. A process as recited in claim 4 and further including the step of rotating the substrate so as to obtain a layer having generally uniform thickness.

9. A process for epitaxially forming a layer of gallium arsenide having a first conductivity on a substrate of gallium arsenide having a second conductivity in an enclosure having an inner liner comprised of a silicon compound, comprising:
   a. decomposing arsine to form arsenic;
   b. chemically reacting a first quantity of hydrogen chloride and gallium to form gallium chloride, said gallium chloride reacting with said arsenic to form gallium arsenide on the substrate, a portion of said first quantity of hydrogen chloride remaining unreacted and tending to cause silicon contaminants from the liner to be deposited on the substrate; and
   c. providing a second quantity of hydrogen chloride into said enclosure, said hydrogen chloride serving to initially etch, and hence clean, the outer surface of the substrate prior to the formation of gallium arsenide thereon, and simultaneously tending to inhibit the formation of silicon contaminants on the substrate, said second quantity and said first quantity having a preselected ratio such that the growth rate of the gallium arsenide layer on the substrate is greater than the etching rate of gallium arsenide due to the second quantity of hydrogen chloride.

10. A process as recited in claim 9 wherein the temperature of said gallium is greater than that of the substrate.

11. A process as recited in claim 10 wherein the temperature of said gallium is in the range between 750 and 776° C. and the temperature of the substrate is in the range between 600° and 750° C.

12. A process as recited in claim 9 and further comprising the step of rotating the substrate so as to obtain a layer having a generally uniform thickness.

13. A process as recited in claim 9 wherein the layer serves as a buffer layer and further comprising the additional steps recited in claim 9 to form a second layer overlaying said buffer layer, said second layer being doped with sulfur so as to have a greater concentration of dopant atoms than said buffer layer.

* * * * *